(12) United States Patent
Johnson et al.

(10) Patent No.: US 9,653,622 B2
(45) Date of Patent: May 16, 2017

(54) IMAGE PICKUP APPARATUS AND IMAGE PICKUP SYSTEM

(71) Applicant: CANON KABUSHIKI KAISHA, Tokyo (JP)

(72) Inventors: Michiko Johnson, Machida (JP); Masahiro Kobayashi, Tokyo (JP); Yoichi Wada, Yokohama (JP); Hiromasa Tsuboi, Koshigaya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 360 days.

(21) Appl. No.: 13/741,686

(22) Filed: Jan. 15, 2013

(65) Prior Publication Data

US 2013/0181309 A1 Jul. 18, 2013

(30) Foreign Application Priority Data

Jan. 18, 2012 (JP) .................. 2012-008198

(51) Int. Cl.
| | |
|---|---|
| H01L 27/146 | (2006.01) |
| H01L 31/02 | (2006.01) |
| H01L 31/0232 | (2014.01) |

(52) U.S. Cl.
CPC .. H01L 31/02002 (2013.01); H01L 27/14605 (2013.01); H01L 27/14609 (2013.01);
(Continued)

(58) Field of Classification Search
CPC ........... H01L 31/02002; H01L 31/0232; H01L 31/0224; H01L 27/14605; H01L 27/14609;
(Continued)

(56) References Cited

U.S. PATENT DOCUMENTS

| | | | |
|---|---|---|---|
| 2009/0152664 A1* | 6/2009 | Klem | ................ H01L 27/14603 257/440 |
| 2009/0212336 A1* | 8/2009 | Iwata | ................ H01L 27/14603 257/292 |

(Continued)

FOREIGN PATENT DOCUMENTS

| | | |
|---|---|---|
| CN | 101290943 A | 10/2008 |
| JP | 2002-165126 A | 6/2002 |

(Continued)

*Primary Examiner* — Allen Parker
*Assistant Examiner* — Leslie Pilar Cruz
(74) *Attorney, Agent, or Firm* — Canon USA, Inc. IP Division

(57) ABSTRACT

An image pickup apparatus includes photoelectric conversion units each including a first semiconductor region of a first conductivity type and a semiconductor region of a second conductivity type disposed in contact with the first semiconductor region, a potential barrier formed between photoelectric conversion units, and a contact plug disposed in an image sensing area. The number of contact plugs is smaller than the number of photoelectric conversion units. The photoelectric conversion units include first and second photoelectric conversion units and are arranged such that at least two first photoelectric conversion units are adjacent in a first direction. The potential barrier includes a first part formed between the two first photoelectric conversion units disposed adjacently and a second part formed between first and second photoelectric conversion units adjacent to each other. The contact plug is located closer to the first part than to the second part.

20 Claims, 8 Drawing Sheets

(52) U.S. Cl.
CPC .... *H01L 27/14645* (2013.01); *H01L 31/0232* (2013.01); *H01L 27/14601* (2013.01)

(58) Field of Classification Search
CPC ......... H01L 27/14636; H01L 27/14645; H01L 31/02024; H01L 31/101; H01L 27/14603; H01L 27/14607; H01L 27/14601; H01L 27/14647
See application file for complete search history.

(56) References Cited

U.S. PATENT DOCUMENTS

| | | | |
|---|---|---|---|
| 2009/0294815 A1* | 12/2009 | Ohtsuki et al. | ............... 257/292 |
| 2009/0294816 A1 | 12/2009 | Park | |
| 2012/0025060 A1* | 2/2012 | Iwata | ................ H01L 27/14603 |
| | | | 250/208.1 |

FOREIGN PATENT DOCUMENTS

| | | |
|---|---|---|
| JP | 2008-270299 A | 11/2008 |
| JP | 2010-273095 A | 12/2010 |
| JP | 2011-176366 A | 9/2011 |
| WO | 96/28806 A2 | 9/1996 |

* cited by examiner

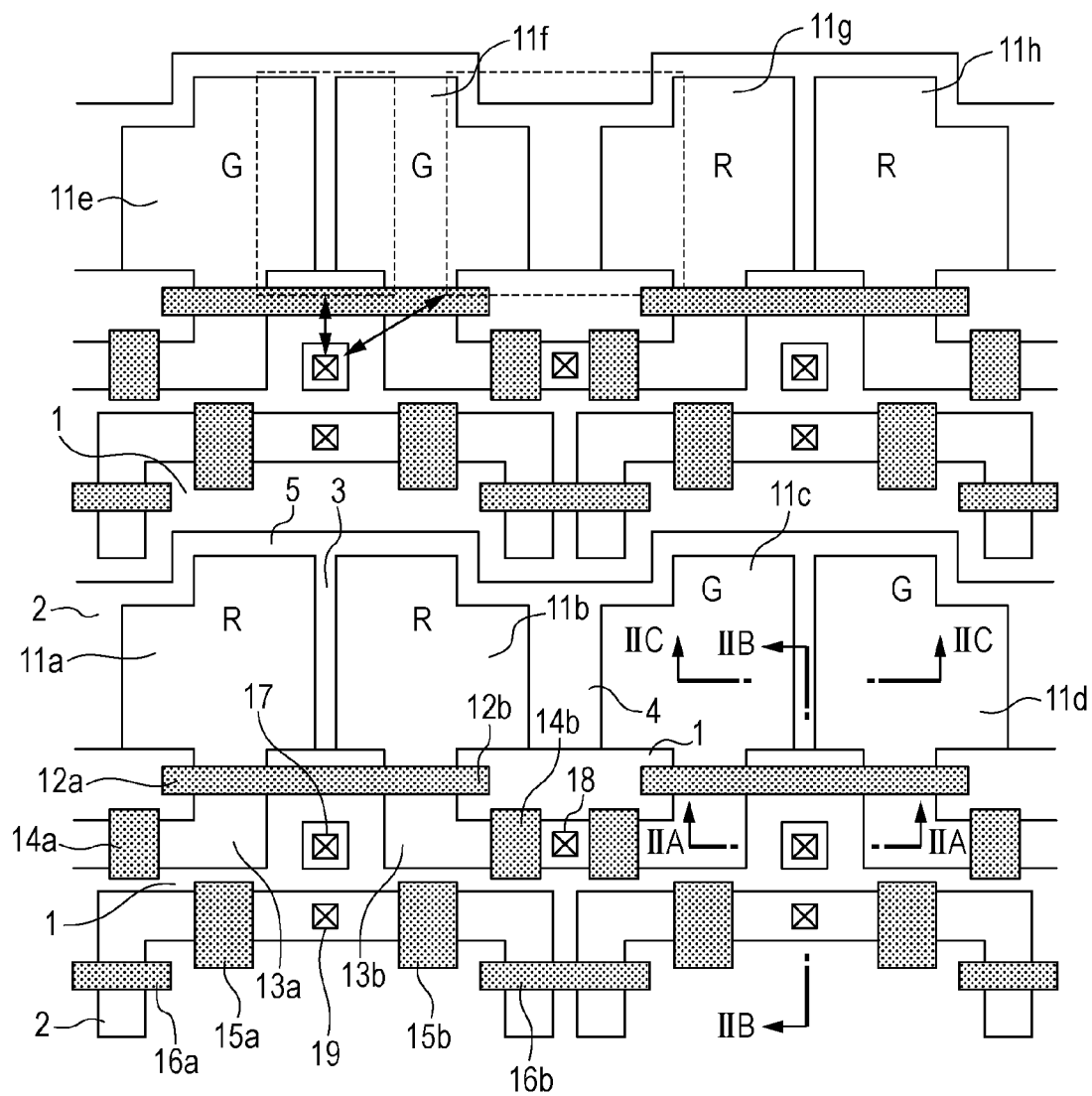

IMAGE PICKUP APPARATUS AND IMAGE PICKUP SYSTEM

BACKGROUND OF THE INVENTION

Field of the Invention

One disclosed aspect of the embodiments relates to an image pickup apparatus and an image pickup system.

Description of the Related Art

In recent years, it has been proposed to configure an image pickup apparatus such that a contact plug for supplying a voltage to a well is disposed in an image sensing area in which a plurality of photoelectric conversion units are disposed. In Japanese Patent Laid-Open No. 2008-270299, FIG. 3 discloses a configuration in which well contact regions are disposed such that one well contact region is assigned to each unit cell including a plurality of photoelectric conversion units. It is also disclosed that color filters are assigned to the respective photoelectric conversion units according to a Bayer array pattern.

On the other hand, it has been proposed to use a phase difference detection technique to achieve a focus detection in an image pickup apparatus. Japanese Patent Laid-Open No. 2002-165126 discloses a solid-state image pickup apparatus in which each pixel has two photoelectric conversion units and one microlens. Light condensed by the one microlens is partly received by one of the two photoelectric conversion units and partly received by the other one. More specifically, the photoelectric conversion units disposed in each pixel are configured to receive light corresponding to different pupil planes of an imaging lens.

SUMMARY OF THE INVENTION

An embodiment provides an image pickup apparatus including a plurality of photoelectric conversion units each including a first-conductivity-type first semiconductor region configured to accumulate a signal charge and a second-conductivity-type semiconductor region disposed in contact with the first semiconductor region, a potential barrier formed between photoelectric conversion units included in the plurality of photoelectric conversion units, and a contact plug disposed in an image sensing area, in which the plurality of photoelectric conversion units are disposed, and configured to supply a voltage to the second-conductivity-type semiconductor region, wherein the number of contact plugs is smaller than the number of photoelectric conversion units included in the plurality of photoelectric conversion units, the plurality of photoelectric conversion units include a plurality of first photoelectric conversion units on which light in a first wavelength range is incident and a plurality of second photoelectric conversion units on which light in a second wavelength range is incident, the plurality of first photoelectric conversion units and the plurality of second photoelectric conversion units are disposed in a first direction such that at least two first photoelectric conversion units included in the plurality of first photoelectric conversion units are adjacent to each other, the potential barrier includes a first part formed between the two first photoelectric conversion units disposed adjacent to each other and a second part formed between a first photoelectric conversion unit and a second photoelectric conversion unit adjacent to each other, and the distance from the contact plug to the first part is smaller than the distance from the contact plug to the second part.

Further features of the disclosure will become apparent from the following description of exemplary embodiments with reference to the attached drawings.

BRIEF DESCRIPTION OF THE DRAWINGS

FIG. 1 is a schematic diagram illustrating a planar layout according to a first embodiment.

DESCRIPTION OF THE EMBODIMENTS

Figure 2A:
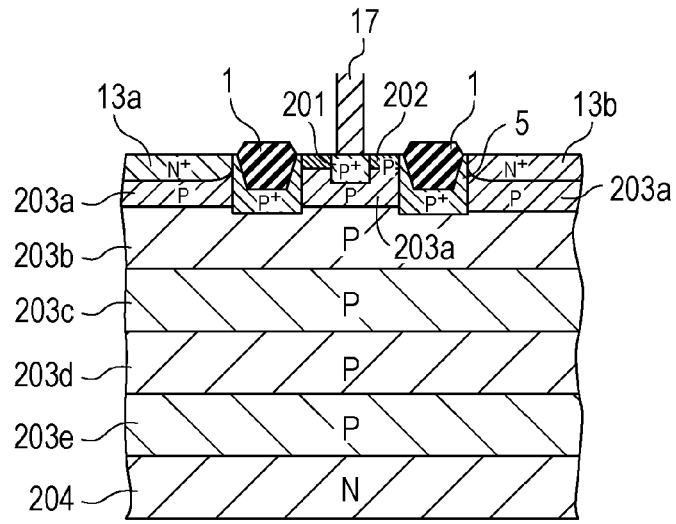
FIG. 2A, FIG. 2B, and FIG. 2C are schematic diagrams illustrating cross-sectional structures according to the first embodiment.

An image pickup apparatus according to one or more embodiments may reduce an effect of noise caused by a well contact plug. One or more embodiments may reduce an effect of noise on image quality. One or more embodiments may reduce an effect of noise on focus detection accuracy.

Japanese Patent Laid-Open No. 2008-270299 does not include a significant consideration on noise caused by a contact plug for supplying a voltage to a well (hereinafter referred to as a well contact plug). It is noted that noise caused by well contact plugs has characteristics described below, which may lead to a difference in noise among different photoelectric conversion units.

First, a discussion is given below on the difference in noise caused by well contact plugs among different photoelectric conversion units.

An example of noise caused by a well contact plug is that originating from a dark current that may occur when the well contact plug is in contact with a semiconductor region. The well contact plug is formed using an electrically conductive material, and thus there are many electrons in the well contact plug. These electrons may flow, as minority carriers, into the semiconductor region. The minority carriers flowing from the well contact plug may cause a dark current.

The magnitude of the noise due to the dark current may change depending on the distance between the photoelectric conversion unit and the well contact plug. As the distance between the photoelectric conversion unit and the well contact plug decreases, the noise due to the dark current from the well contact plug may increase, because the reduction in the distance between the photoelectric conversion unit and the well contact plug may allow the electrons flowing from the well contact plug to more easily reach the photoelectric conversion unit. Therefore, when well contact plugs are disposed such that there is one well contact plug for each particular number of photoelectric conversion units, the distance from the well contact plug to a photoelectric conversion unit may be different depending on the photoelectric conversion unit. That is, the magnitude of noise may be different among the photoelectric conversion units.

In the case where a plurality of well contact plugs are disposed in an image sensing area, an amount of dark current generated from each well contact plug may be different among well contact plugs, for example, due to a variation in a production process condition or the like. A difference in the production process condition may result in a difference in the number of defect levels in the semiconductor region in contact with a different well contact plug, or may result in a difference in an impurity concentration distribution in the semiconductor region in contact with the different well contact plug. The factors described above may cause a difference in the amount of the dark current among the well contact plugs. Therefore, when an image pickup apparatus is designed, if only the distance between the well contact plug and the photoelectric conversion unit is taken into account, it may be difficult to eliminate the difference in the magnitude of noise.

It is noted that there is a possibility that the magnitude of noise may be different among photoelectric conversion units as described above. Next, a discussion is given below on an effect of the difference in the magnitude of noise among photoelectric conversion units on a performance of an image pickup apparatus.

In the case of a color image pickup apparatus, wavelength selection units such as color filters are disposed periodically according to a particular pattern. Depending on the arrangement pattern of the color filters, the difference in the magnitude of noise among photoelectric conversion units may cause a reduction in image quality. In particular, in a case where two photoelectric conversion units on which light in the same wavelength range is incident are disposed adjacent to each other (i.e., two photoelectric conversion units for the same color are disposed adjacent to each other), a difference in the magnitude in noise between them results in a significant effect on image quality. This is because amounts of light incident on such photoelectric conversion units for the same color are almost equal in many cases. In this situation, if there is a difference in the magnitude of noise, then a difference may occur in a magnitude of an output signal although the amount of incident light is almost equal. On the other hand, in the case of the Bayer array pattern disclosed in Japanese Patent Laid-Open No. 2008-270299, color filters are disposed such that photoelectric conversion units disposed at adjacent locations are different in color. In most cases, amounts of light incident on photoelectric conversion units are different among different colors, and thus a difference in the magnitude of noise does not cause a significant effect such as that described above. In contrast, as described above, when adjacent photoelectric conversion units are the same in color, the difference in the magnitude in noise may cause a significant influence on the picture quality.

It is further noted that when a focus detection is performed based on a phase difference detection using a plurality of photoelectric conversion units, a difference in noise among photoelectric conversion units may cause a reduction in focus detection accuracy.

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

First Group of Embodiments

First group of embodiments is described below with reference to FIG. 1. In the first group of embodiments, an image pickup apparatus includes a plurality of photoelectric conversion units. An image sensing area is an area in which those photoelectric conversion units are disposed. In a case where the photoelectric conversion units are disposed in the form of a two-dimensional array, the edge of the image sensing area may be defined by a line passing through photoelectric conversion units at most outward locations. Each photoelectric conversion unit is, for example, a photodiode (hereinafter, referred to as a PD) 11. Each PD includes an N-type (first conductivity type) semiconductor region and a P-type (second conductivity type) semiconductor region. A PN junction is formed by the N-type semiconductor region and the P-type semiconductor region. The P-type semiconductor region is, for example, in the form of a P-type well. These photoelectric conversion units are arranged in a first direction. Potential barriers 3 and 4 may occur between adjacent photoelectric conversion units. An isolation unit may be disposed to electrically isolate each photoelectric conversion unit from other elements such as a transistor.

Note that the photoelectric conversion units may be arranged in the first direction such that centers of gravity of the photoelectric conversion units are in a straight line, or centers of gravity of the photoelectric conversion units are located in a zigzag manner.

A wavelength selection unit such as a color filter is disposed on each photoelectric conversion unit. For example, when a color filter that allows light in a red wavelength range to pass through is disposed on a photoelectric conversion unit, light in the red wavelength range is incident on this photoelectric conversion unit. The plurality of photoelectric conversion units arranged in the first direction include a plurality of photoelectric conversion units on which light in a first wavelength range (for example, a red wavelength range) is incident and a plurality of photoelectric conversion units on which light in a second wavelength range (for example, a green wavelength range) is incident.

The photoelectric conversion units assigned with the respective colors are disposed alternately in a periodic pattern. The photoelectric conversion units are disposed such that at least two photoelectric conversion units on which light with the same color is incident are adjacent to each other. For example, two photoelectric conversion units on which red light is incident (hereinafter, also referred to simply as "red photoelectric conversion units") are disposed adjacent to each other, and two photoelectric conversion units on which green light is incident (hereinafter, also referred to simply as "green photoelectric conversion units") are disposed adjacent to each other next to the two red photoelectric conversion units. A series of these four photoelectric conversion units is disposed periodically, i.e., photoelectric conversion units are disposed in the order red, red, green, green, red, red, green, green, and so on. Note that the number of photoelectric conversion units included in a basic unit series in the periodic pattern is not limited to two. For example, the basic unit series may include two adjacent red photoelectric conversion units and one green photoelectric conversion unit next to the two red photoelectric conversion units, and this basic unit series including the three photoelectric conversion units may be repeated. As described above, the basic unit series includes at least two photoelectric conversion units with the same color at adjacent locations.

In the present description, photoelectric conversion units on which light in a same-color wavelength range is incident are referred to as same-color photoelectric conversion units, while photoelectric conversion units on which light in a different-color wavelength range is incident are referred to as different-color photoelectric conversion units.

The image pickup apparatus includes at least one contact plug 17 for supplying a particular voltage such as a ground voltage (hereinafter, referred to as a GND voltage) to a semiconductor region (hereinafter, such a contact plug is referred to as a well contact plug). The contact plug is formed using an electrically conductive material such that the contact plug is in contact with the semiconductor region. For example, the contact plug is formed using a metal such as tungsten or an alloy. The contact plug may include a barrier metal and the barrier metal may be in contact with the semiconductor region. The contact plug may also be connected to a wiring.

The well contact plug is a contact plug constructed in the form of a well which is disposed so as to be in contact with the semiconductor region configured to accumulate a signal charge generated in the photoelectric conversion unit. In a case where the photoelectric conversion unit is realized by a PD including a PN junction and electrons are accumulated as signal charges, the well contact plug is connected to a P-type semiconductor region of the PD. In this case, the P-type semiconductor region may be formed such that the P-type semiconductor region continuously extends from the PN junction plane to the well contact plug. Note that the P-type semiconductor region may include a part with a high impurity concentration and a part with a low impurity concentration. For example, the P-type semiconductor region may include a part with a higher impurity concentration in contact with the contact plug than impurity concentrations of other parts. On the other hand, in a case where the photoelectric conversion unit accumulates holes as signal charges, the well contact plug is connected to an N-type semiconductor region.

In the image pickup apparatus according to embodiments, the number of well contact plugs disposed in the image sensing area is less than the number of photoelectric conversion units. For example, well contact plugs are disposed such that there is one well contact plug for each two photoelectric conversion units. It may be advantageous to dispose well contact plugs in a periodic pattern, although the well contact plugs may be disposed randomly. It may be advantageous to provide two or more well contact plugs in the image sensing area, although the image sensing area may include only one well contact plug.

In the first group of the embodiments, at least part of well contact plugs are each located closer to a potential barrier between same-color photoelectric conversion units than to a potential barrier between different-color photoelectric conversion units. In other words, the distance from the well contact plug to any of two same-color photoelectric conversion units located adjacently is smaller than the distance from the well contact plug to any different-color photoelectric conversion unit. More specifically, for example, when photoelectric conversion units are arranged in a first direction, a well contact plug may be disposed in a region between each two same-color photoelectric conversion units adjacent to each other in the first direction. Note that the same-color photoelectric conversion units are two photoelectric conversion units respectively covered with color filters that allow light, for example, in a red wavelength range to pass therethrough.

The potential barrier is a region in which a potential for signal charges accumulated in the photoelectric conversion unit is higher than in the photoelectric conversion unit. For example, in the case where the photoelectric conversion unit is a PD including a PN junction, and signal charges are electrons, then the potential barrier is a region in which a potential for electrons is higher than in an N-type semiconductor region. On the other hand, in the case where signal charges are holes, then the potential barrier is a region in which a potential for holes is higher than in a P-type semiconductor region.

The potential barrier may be formed by an isolating insulator unit such as STI (Shallow Trench Isolation), LOCOS (LOCal Oxidation of Silicon), a mesa-type isolation unit, or the like. Insulators have a greater band gap than semiconductors have. Therefore, an insulator may be used to form a potential barrier for both types of carries, i.e., electrons and holes, in a semiconductor. In the case where signal charges are electrons, the potential barrier may be formed by a P-type semiconductor region. On the other hand, in the case where signal charges are holes, the potential barrier may be formed by an N-type semiconductor region. Alternatively, the potential barrier may be formed by disposing an electrode on a semiconductor substrate and applying a voltage to the electrode so as to form the potential barrier. As the voltage applied to the electrode becomes lower, the potential for electrons becomes higher. Conversely, as the voltage applied to the electrode becomes higher, the potential for holes becomes higher.

In all embodiments described below in the present description, states expressed by "a potential barrier is disposed or formed", include at least a state in which a potential barrier is formed or may be formed in any of the configurations described above.

A potential barrier between two photoelectric conversion units is a part located between N-type semiconductor regions included in the respective photoelectric conversion units. An example of such a potential barrier is that in a region enclosed in a dotted-line box in FIG. 1.

In a case where the potential barrier is formed by an isolating insulator unit, the distance from the potential barrier is defined by the distance from an edge of the insulator forming the potential barrier. In the case where the potential barrier is formed by a semiconductor region, the distance from the potential barrier is defined by the distance from an edge of the semiconductor region forming the potential barrier. In the case where the potential barrier is formed by applying a voltage to an electrode, the distance from the potential barrier is defined by the distance from an edge of the electrode. In this case, the distance from the well contact plug to the photoelectric conversion unit is defined by the distance from the well contact plug to an edge of the semiconductor region that is included in the photoelectric conversion unit and that accumulates electric charges. For example, in the case where signal charges are electrons, the distance is defined by the distance from the well contact plug to the edge of the N-type semiconductor region.

As described above, at least part of the well contact plugs are each disposed in a region between same-color photoelectric conversion units. This allows a reduction in the effect of noise caused by the well contact plugs, as is described in further below.

As a comparative example, a discussion is given below on a structure in which well contact plugs are each disposed only between different-color photoelectric conversion units. In this case, the distance from one of two adjacent same-color photoelectric conversion units to a well contact plug is smaller than the distance from the other one to the well contact plug. More specifically, in FIG. 1, let's us assume that a well contact plug is disposed only between the PD 11b and the PD 11c. In this case, the distance from the PD 11b to the well contact plug is smaller than the distance from a PD 11a to the well contact plug. Note that the PD 11a and the PD 11b are same-color photoelectric conversion units, and the PD 11c is a different-color photoelectric conversion unit. In this comparative example, a dark current caused by the well contact plug flows more into the photoelectric conversion unit located closer to the well contact plug. This may result in an increase in a difference in noise between the two same-color photoelectric conversion units adjacent to each other. Such a great difference in noise between same-color photoelectric conversion units may cause the noise to be conspicuous in an image, which result in degradation in image quality.

Let us consider another comparative example in which a series of two photoelectric conversion units with a first color and two photoelectric conversion units with a second color different from the first color is disposed periodically such that the color changes alternately every two photoelectric conversion units, and a well contact plug is disposed between each two different-color photoelectric conversion units. More specifically, for example, a first well contact plug is disposed between a PD (not shown) left to the PD 11a and the PD 11a, and a second well contact plug is disposed between the PD 11b and PD 11c. In this case, the distance from the PD 11a to the first well contact plug is nearly equal to the distance from the PD 11b to the second well contact plug. However, as described above, a variation in production process condition may cause a great difference between an amount of dark current generated in a contact plug and an amount of dark current generated in another different contact plug. Therefore, there may be a difference between the magnitude of noise in the PD 11a and the magnitude of noise in the PD 11b. That is, there may be a great difference in noise between two same-color photoelectric conversion units disposed adjacent to each other. Such a great difference in noise between same-color photoelectric conversion units may cause the noise to be conspicuous in an image, which result in degradation in image quality.

In contrast, in the embodiments, a well contact plug is disposed in a region between same-color photoelectric conversion units. An example of a region between same-color photoelectric conversion units is a region in which a well contact plug 17 is disposed in FIG. 1. This configuration allows the dark currents flowing in the respective two same-color photoelectric conversion units to be nearly equal, which results in an improvement in image quality.

Note that it may be advantageous to dispose well contact plugs such that any well contact plug is located between in some region between same-color photoelectric conversion units. However, to achieve a particular electric characteristic, part of well contact plugs may be disposed in a region between different-color photoelectric conversion unit. Note that this configuration also falls within the scope of the embodiments.

In the present group of embodiments, the image pickup apparatus may include a lens for condensing light incident on photoelectric conversion units. In this case, a plurality of lenses may be disposed in the form of an array. Lenses may be disposed such that one lens is assigned to each photoelectric conversion unit or such that one lens is assigned to a plurality of same-color photoelectric conversion units adjacent to each other. The lens has a function of condensing or focusing incident parallel light. The lens may be, for example, a microlens formed using an organic material.

Next, embodiments of the first group are respectively described below. Note that in the following description of these embodiments, it is assumed by way of example that the first conductivity type is N-type and the second conductivity type is P-type, and it is also assumed that electrons are accumulated as signal charges in the photoelectric conversion units. Note that the first conductivity type may be P-type and the second conductivity type may be N-type, which also falls in the scope of the embodiments. In this case, holes are accumulated as signal charges in the photoelectric conversion units. These embodiments are different from the previous embodiments only in that the conductivity types are opposite, and thus a description thereof is omitted. Note that the scope of the disclosure also includes an image pickup system including an image pickup apparatus according to one of the embodiments described below and a signal processing apparatus configured to process a signal output from the image pickup apparatus. The signal processing apparatus may be realized using a known technique.

First Exemplary Embodiment

A first exemplary embodiment is described below with reference to drawings. FIG. 1 is a schematic diagram illustrating a planar layout of an image pickup apparatus according to the first exemplary embodiment.

The image pickup apparatus according to the present embodiment includes a plurality of photoelectric conversion units. Each photoelectric conversion unit includes elements which are similar among different photoelectric conversion units. In the present description, each element is denoted by a combination of a numeral and an alphabetic character. Elements which are similar in function are denoted by similar numerals. An alphabetic character following a numeral indicates a correspondence to a PD. When distinguishment is not necessary, only a numeral is used to generically denote an element with no alphabetic suffix.

The image pickup apparatus according to the present embodiment includes a semiconductor substrate including a field region 1 and an active region 2. The semiconductor substrate is, for example, a silicon substrate. The field region 1 is an isolating insulator unit such as STI or LOCOS. The insulator is, for example, a silicon oxide film. In the active region 2, a semiconductor region forming a photoelectric conversion unit or a transistor is disposed.

In the active region 2, PDs 11a to 11h are disposed. Each PD includes an N-type semiconductor region. The N-type semiconductor region and a P-type semiconductor region form a PN junction and thus form a PD. The P-type semiconductor region forming the PD includes, for example, a dark current preventing layer disposed on a surface, a semiconductor region forming a potential barrier, a dark current preventing layer disposed adjacent to an isolating insulator unit, a channel stopper layer, a well, a semiconductor substrate, etc. In the N-type semiconductor region forming the PD, electrons are accumulated as signal charges.

The PD 11a to the PD 11d are arranged in a line in the first direction. The PD 11a and the PD 11b are covered with a red color filter. The PD 11c to the PD 11f are covered with a green color filter. The PD 11g and the PD 11h are covered with a blue color filter. As shown in FIG. 1, two same-color PDs are disposed adjacently in the first direction. As described above, the image pickup apparatus according to the present embodiment includes wavelength selection units of two or more colors in total. Light in a wavelength range selected by the red color filter 106 is incident on the PDs 11a and 11b. Light in a wavelength range selected by the green color filter is incident on the PDs 11c to 11f. Light in a wavelength range selected by the blue color filter is incident on the PDs 11g and 11h.

In the present embodiment, a potential barrier 3 formed by a P-type semiconductor region is disposed between two same-color PDs 11a and 11b, and a potential barrier 4 formed by a P-type semiconductor region is disposed between two different-color PDs 11b and 11c. The P-type semiconductor region forming the potential barrier 4 has a length in the first direction greater than the length in the first direction of the P-type semiconductor region forming the potential barrier 3. An edge of the P-type semiconductor region is a PN junction plane. That is, the distance between the N-type semiconductor region included in the PD 11b and the N-type semiconductor region included in the PD 11c is greater than the distance between the N-type semiconductor region included in the PD 11a and the N-type semiconductor region included in the PD 11b.

A P-type semiconductor region 5 is disposed between a PD and the isolating insulator unit forming the field region 1. The P-type semiconductor region 5 serves as a dark current preventing layer that reduces intruding of a dark current generated at an interface of the insulator into the PD.

The active region 2 includes floating diffusion (hereinafter referred as FD) regions 13a and 13b, into which electric charges are to be transferred from PDs. The active region 2 also includes transfer transistors 12a and 12b configured to an electric charge from the FD 11 to the FD region 13. The FD regions 13a and 13b are respectively connected to amplifying transistors 15a and 15b via wirings (not shown). The amplifying transistors 15a and 15b are amplifying elements configured to amply signals generated by PDs. The active region 2 also includes reset transistors 14a and 14b and selection transistors 16a and 16b. The reset transistor 14 resets an input of the amplifying transistor 15 to a particular voltage. The selection transistor 16 controls an electrical connection between a source of the amplifying transistor 15 and a vertical output line (not shown). In the present embodiment, drains of the amplifying transistors 15a and 15b are formed by a common semiconductor region and connected to a power supply line via a common contact plug 19. Drains of two reset transistors 14 corresponding to different-color photoelectric conversion units are formed by a common semiconductor region and connected to a common contact plug 18.

In the present embodiment, a well contact plug 17 is disposed to supply a voltage to a P-type semiconductor region forming a PD. The well contact plug 17 is formed by an electrically conductive material such as tungsten. The well contact plug 17 is disposed at a location closer to the potential barrier 3 disposed between two same-color PDs 11a and 11b than to the potential barrier 4 between two different-color PDs 11b and 11c.

Furthermore, the well contact plug 17 is located in a region extending, in a second direction cross the first direction, from the P-type semiconductor region forming the potential barrier 3. That is, the well contact plug 17 located outside the potential barrier 3. The well contact plug 17 may be located at the center between two photoelectric conversion units as shown in FIG. 1. Edge of a P-type semiconductor region is at a boundary between the P-type semiconductor region and an insulator forming an isolating insulator unit or at a boundary between the P-type semiconductor region and an N-type semiconductor region.

In the present embodiment, no well contact plug is disposed between different-color photoelectric conversion units. However, to achieve a particular electric characteristic, a well contact plug may be disposed between different-color photoelectric conversion units.

Note that the contact plug 18 for supplying a voltage to the drain of the amplifying transistor 15 may be disposed at a location closer to the potential barrier 3 than to the potential barrier 4. The amplifying transistor 15 is disposed in the image sensing area.

Figure 2B:
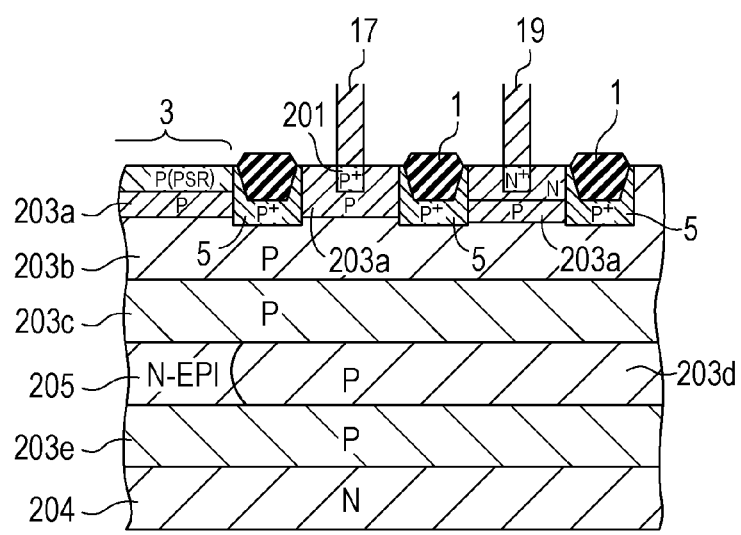
Figure 2C:
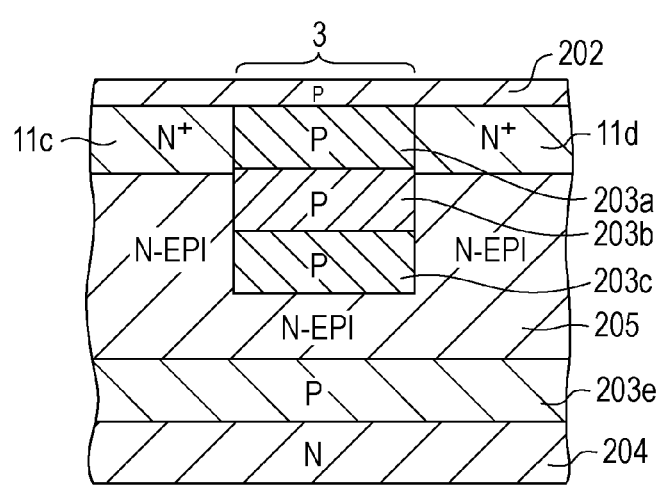

FIGS. 2A, 2B, and 2C are schematic diagrams illustrating cross sections of the image pickup apparatus according to the first exemplarity embodiment. FIG. 2A illustrates a cross section taken along line IIA-IIA of FIG. 1. FIG. 2B illustrates a cross section taken along line IIB-IIB of FIG. 1. FIG. 2C illustrates a cross section taken along line IIC-IIC of FIG. 1.

As illustrated in FIG. 2A and FIG. 2B, the well contact plug 17 is in contact with a high-concentration P-type semiconductor region 201. It may be advantageous that the P-type semiconductor region 201 has an impurity concentration higher than that of the neighboring P-type semiconductor region 203a. By electrically connecting the high-concentration semiconductor region to the well contact plug 17 in the above-described manner, it becomes possible to reduce a contact resistance between the well contact plug 17 and the semiconductor region.

An isolating insulator unit (field region 1) is disposed between the region in which the well contact plug 17 is disposed and neighboring elements. For example, as illustrated in FIG. 2B, an isolating insulator unit (field region 1) is disposed between the P-type semiconductor region 203a in which the well contact plug 17 is disposed and the P-type semiconductor region forming the potential barrier 3. The isolating insulator unit (field region 1) reduces an effect of a dark current caused by the well contact plug 17 such that the amount of dark current reaching the photoelectric conversion unit is reduced.

The P-type semiconductor region 5 is disposed below the isolating insulator unit (field region 1). Thus, the P-type semiconductor region continuously extends from the well contact plug 17 to the PN junction plane of the P-type semiconductor region forming the potential barrier 3. Therefore, the voltage is supplied to the potential barrier 3 from the well contact plug 17 even in the structure in which the potential barrier 3 is isolated by the isolating insulator unit (field region 1) from the part at which the well contact plug 17 is in contact with the semiconductor region.

Although not shown in FIG. 2B, a gate electrode of the transfer transistor 12 is disposed on the isolating insulator unit disposed between the well contact plug 17 and the potential barrier 3. When the photoelectric conversion unit is accumulating a signal charge, a voltage is supplied to the gate electrode of the transfer transistor 12 such that a potential barrier for the signal charge is formed. For example, in the case where the signal charge is provided by electrons, the same voltage as the GND voltage supplied to the wells or a negative voltage lower than the GND voltage is supplied. Therefore, in this configuration, it is possible to suppress the effect of the dark current due to the well contact plug 17 such that the amount of dark current reaching the photoelectric conversion unit is reduced.

The P-type semiconductor regions 203a to 203e may function as part of a well or the potential barriers 3 and 4. An N-type semiconductor region 204 is disposed below the P-type semiconductor regions 203.

FIG. 2C illustrates cross sections of two same-color PDs 11c and 11d. As illustrated in FIG. 2C, the PD 11 is disposed on an N-type epitaxial layer 205. The PD 11 may include an N-type semiconductor region with an impurity concentration higher than that of the N-type epitaxial layer 205. The potential barrier 3 is disposed between the PD 11c and the PD 11d. The potential barrier 3 includes P-type semiconductor regions 203a to 203c disposed on a surface-side of the semiconductor substrate. In a deep part of the substrate, the N-type epitaxial layer 205 continuously extends from the PD 11c to the PD 11d. By forming the N-type semiconductor region such that it continuously extends in the deep part of the substrate as described above, the two PDs are electrically connected. As a result, when saturation occurs in one of the PDs, an overflowing electric charge easily flows into the other PD. As a result, color mixing is reduced, and an increase in sensitivity is achieved.

A P-type semiconductor region 202 is disposed on the surfaces of the PD 11. The P-type semiconductor region 202 functions as a dark current preventing layer that prevents a dark current generated on the surface from intruding into the PD. The P-type semiconductor region 202 may be disposed in a region in which the well contact plug 17 is disposed.

Figure 3A:
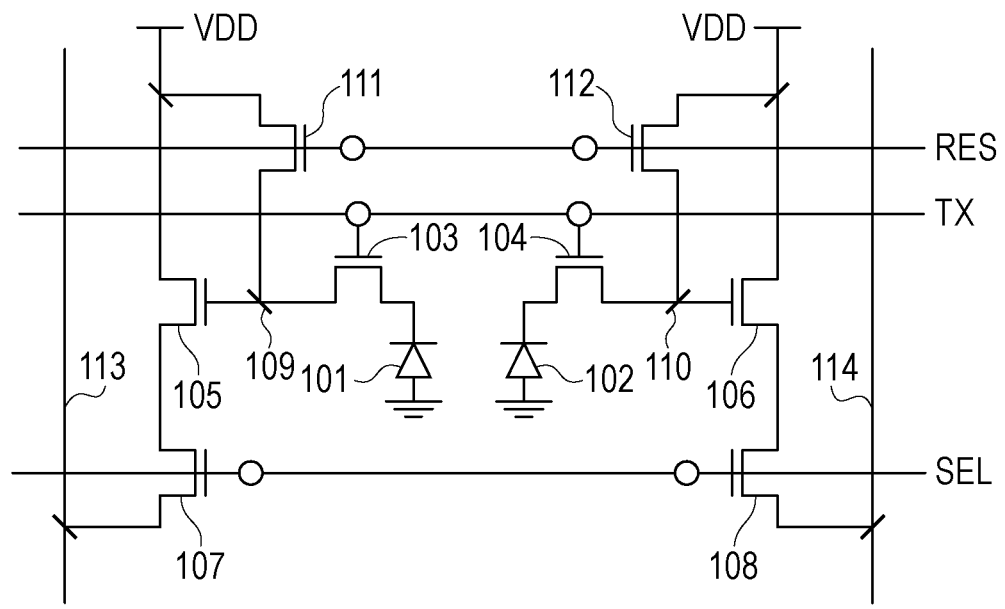
FIG. 3A is a diagram illustrating an equivalent circuit.
Figure 3B:
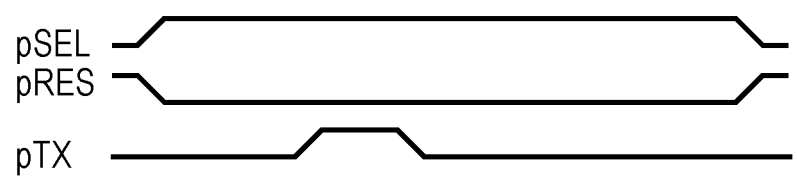
FIG. 3B is a diagram illustrating driving pulses.

Next, referring to an equivalent circuit diagram illustrated in FIG. 3A and a driving diagram illustrated in FIG. 3B, an operation according to the present embodiment is described below. The equivalent circuit diagram illustrated in FIG. 3A includes PDs 101 and 102, transfer transistors 103 and 104, amplifying transistors 105 and 106, selection transistors 107 and 108, FD nodes 109 and 110, reset transistors 111 and 112, and signal output lines 113 and 114 for outputting signals. FIG. 3B illustrates driving pulses respectively supplied to a SEL node, a RES node, and a TX node illustrated in FIG. 3A.

When the reset transistors 111 and 112 turn on, the corresponding FD nodes 109 and 110 are reset to a reset voltage (for example, a voltage equal to a power supply voltage). Thereafter, when the selection transistors 107 and 108 turn on, it becomes possible to output signals from the corresponding amplifying transistors 105 and 106 to the respective signal output lines 113 and 114.

Light passed through color filters is incident on the PDs 101 and 102. The respective PDs 101 and 102 generate and accumulate charges corresponding to amounts of incident light. Thereafter, when the transfer transistors 103 and 104 turn on, the electric charges accumulated in corresponding photoelectric conversion units are transferred to the respective FD nodes 109 and 110. The FD nodes 109 and 110 are input nodes of the amplifying transistors 105 and 106. Based on the charges transferred to the FD nodes 109 and 110, the amplifying transistors 105 and 106 output signals to the respective signal output lines 113 and 114.

Note that the selection transistors may be omitted. In this case, for example, a selection operation may be performed by controlling the reset voltage supplied to the FDS.

In the configuration described above, the well contact plug 17 is disposed at a location substantially equally apart from the PDs 11a and 11b. This causes the PDs 11a and 11b to substantially equally receive a diffusing dark current due to the well contact plug 17. That is, it is possible to reduce the difference in noise intruding into the two same-color PDs. As a result, an improvement in image quality is achieved.

Furthermore, in the image pickup apparatus according to the present embodiment, the island-shaped active region 2 is disposed between same-color PDs, and the well contact plug is disposed in the active region 2. This configuration makes it possible to suppress the difference in amount of noise applied to same-color photoelectric conversion units without reducing an aperture ratio of photoelectric conversion units. As a result, an improvement in image quality is achieved.

Modification of First Exemplary Embodiment

Figure 4:
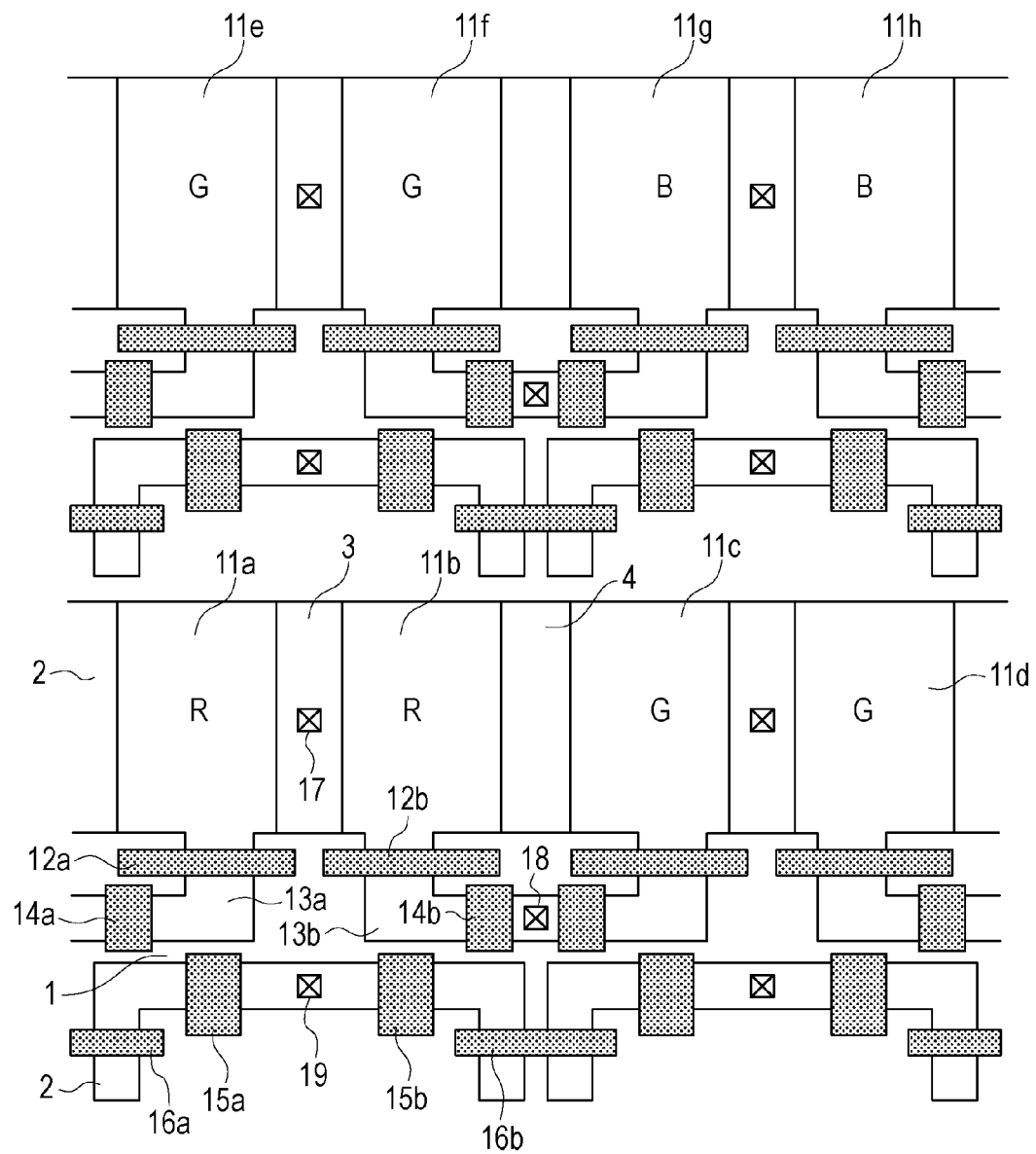
FIG. 4 is a schematic diagram illustrating a planar layout according to a modification of the first embodiment.

FIG. 4 is a schematic diagram illustrating a planar layout according to a modification of the first exemplary embodiment. Elements having similar functions to those of elements illustrated in FIG. 1 are denoted by similar reference symbols, and a further detailed description thereof is omitted.

In this modification, the location of the well contact plug 17 is different from that according to the first exemplary embodiment. More specifically, the well contact plug 17 is disposed inside the potential barrier 3 between same-color PDs 11a and 11b such that the well contact plug 17 is in contact with the P-type semiconductor region forming the potential barrier 3. Also in this case, the location of the well contact plug 17 is closer to the potential barrier 3 between the same-color photoelectric conversion units than to the potential barrier 4 between different-color photoelectric conversion units.

As described above, the location of the well contact plug 17 as seen in a second direction crossing the first direction may be inside a potential barrier located between N-type semiconductor regions included in PDs.

In the configuration according to the present modification, the well contact plug 17 is disposed at a location substantially equally apart from the PDs 11a and 11b. This causes the PDs 11a and 11b to substantially equally receive a diffusing dark current due to the well contact plug 17. That is, it is possible to reduce the difference in intruding noise between the two same-color PDs. As a result, an improvement in image quality is achieved.

In this modification, an equivalent circuit and a driving method are similar to those according to the first exemplary embodiment, and elements that are not described above are similar to those according to the first exemplary embodiment.

Second Exemplary Embodiment

Figure 5:
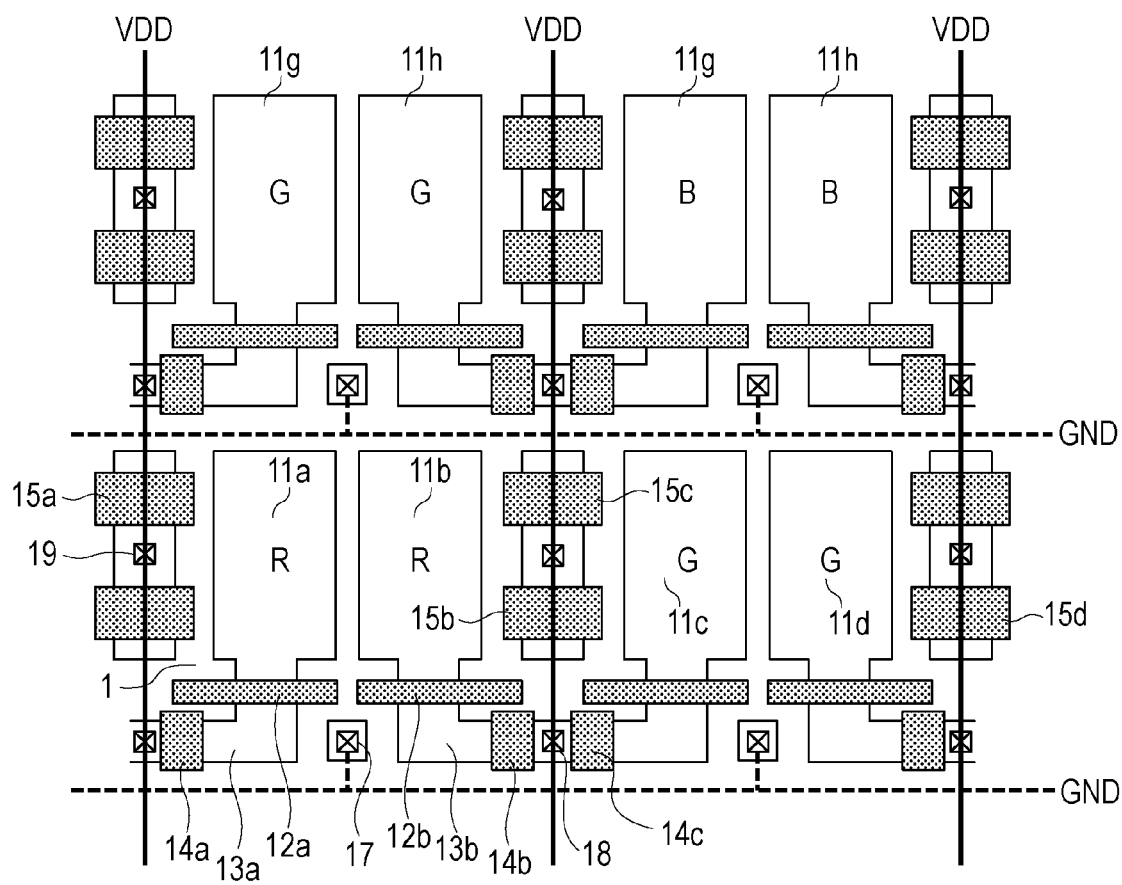
FIG. 5 is a schematic diagram illustrating a planar layout according to a second embodiment.

A second exemplary embodiment is described below with reference to drawings. FIG. 5 is a schematic diagram illustrating a planar layout according to a second exemplary embodiment. Elements having similar functions to those of elements illustrated in FIG. 1 are denoted by similar reference symbols, and a further detailed description thereof is omitted.

In the second exemplary embodiment, the location of the amplifying transistor 15 is different from that according to the first exemplary embodiment. More specifically, the amplifying transistors 15b and 15c are disposed between two different-color PDs 11b and 11c disposed adjacently in the first direction.

Furthermore, in the present embodiment, drains of the amplifying transistors 15b and 15c corresponding to the two different-color PDs 11b and 11c are formed by a common semiconductor region, and drains of the reset transistors 14b and 14c corresponding to the two different-color PDs 11b and 11c are formed by a common semiconductor region. Therefore, by disposing a power supply line for supplying a power supply voltage VDD so as to extend between the two different-color PDs 11b and 11c, it is possible to supply the power supply voltage VDD to both amplifying transistors 15 and the reset transistors 14. As a result, high symmetry in the wiring pattern is achieved, which results in a reduction in difference in fixed-pattern noise between same-color photoelectric conversion units.

Although not shown in the figure, the transfer transistors 12, the reset transistors 14, and the selection transistors 16 may be disposed between two different-color photoelectric conversion units. Note that such a modified configuration also falls within the scope of the embodiments.

In the present embodiment, a GND line connected to a well contact plug is disposed so as to extend in the first direction.

In the configuration according to the present embodiment, as in the first exemplary embodiment, the well contact plug 17 is disposed at a location substantially equally apart from the PDs 11a and 11b. This causes the PDs 11a and 11b to substantially equally receive a diffusing dark current due to the well contact plug 17. That is, it is possible to reduce the difference in intruding noise between the two same-color PDs. As a result, an improvement in image quality is achieved.

Furthermore, in the image pickup apparatus according to the present embodiment, amplifying transistors are disposed between two different-color PDs. In this configuration, when saturation occurs in a photoelectric conversion unit, it is possible to suppress overflowing of a charge into a different-color photoelectric conversion unit. As a result, color mixing is reduced.

In the present embodiment, an equivalent circuit and a driving method are similar to those according to the first exemplary embodiment, and elements that are not described above are similar to those according to the first exemplary embodiment.

Third Exemplary Embodiment

Figure 6:
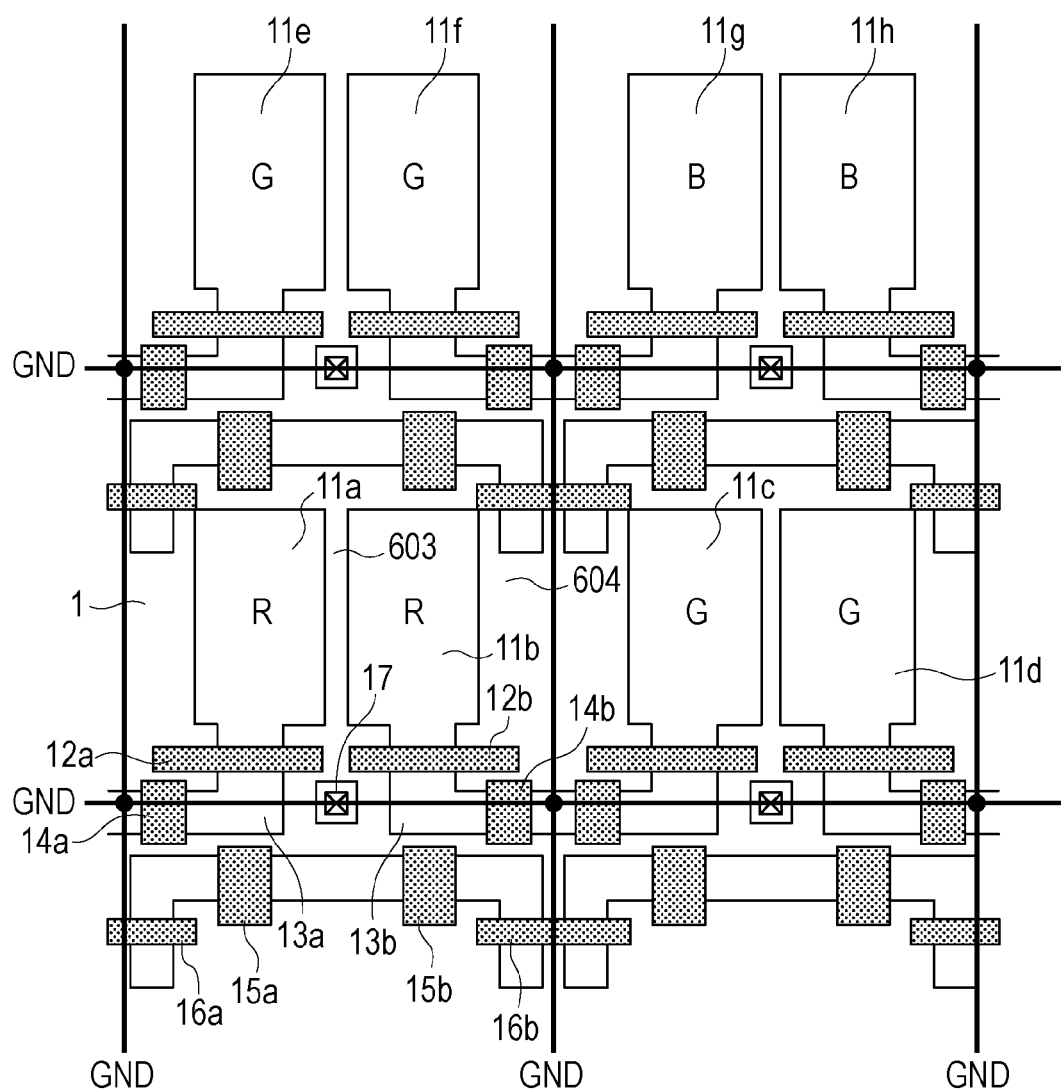
FIG. 6 is a schematic diagram illustrating a planar layout according to a third embodiment.

A third exemplary embodiment is described below with reference to drawings. FIG. 6 is a schematic diagram illustrating a planar layout according to the third exemplary embodiment. Elements having similar functions to those of elements illustrated in FIG. 1 are denoted by similar reference symbols, and a further detailed description thereof is omitted.

The present embodiment is characterized in a planar pattern of wirings connected to well contact plugs 17. That is, an electrically conductive material of a GND wiring connected to well contact plugs 17 is formed in a lattice pattern. The electrically conductive material forming the GND wiring is disposed between two different-color PDs. However, no GND wiring is disposed between two adjacent same-color PDs.

In the present embodiment, the image pickup apparatus includes a plurality of wiring layers. The electrically conductive material of the GND wiring is disposed in a top wiring layer in the plurality of the wiring layers. The top wiring layer refers to a wiring layer located farthest from the semiconductor substrate.

The electrically conductive material for the GND wiring may be a metal such as aluminum, copper, etc. Alternatively, the electrically conductive material for the GND wiring may be an alloy.

In the configuration according to the present embodiment, as in the first exemplary embodiment, the well contact plug 17 is disposed at a location substantially equally apart from the PDs 11a and 11b. This causes the PDs 11a and 11b to substantially equally receive a diffusing dark current due to the well contact plug 17. That is, it is possible to reduce the difference in intruding noise between the two same-color PDs. As a result, an improvement in image quality is achieved.

Furthermore, in the present embodiment, the GND wiring having the lattice pattern extends between different-color photoelectric conversion units. This configuration allows a reduction in color mixing due to obliquely incident light. In a case where the image pickup apparatus includes a plurality of wiring layers, a further reduction in color mixing is achieved by disposing the wiring with the lattice pattern in the top wiring layer.

Furthermore, in the present embodiment, PDs arranged in a line in the first direction are isolated from each other by an isolating insulator unit. More specifically, a potential barrier 603 disposed between same-color PDs 11a and 11b is formed by part of the isolating insulator unit. Furthermore, a potential barrier 604 disposed between different-color PDs 11b and 11c is formed by part of the isolating insulator unit. As described above, in the present embodiment, an isolation unit between two PDs may be formed by an insulator.

Use of the isolating insulator unit for isolating photoelectric conversion unit makes it possible to reduce intruding of an overflowing charge into an adjacent photoelectric conversion unit. As a result, a further reduction in color mixing is achieved.

Note that the configuration associated with the GND wiring according to the present embodiment may be applied to the first exemplary embodiment described above. Note that this modification also falls within the scope of the embodiments. That is, the effects of the wiring pattern described above may be obtained when the wiring pattern is applied to the first exemplary embodiment in which a potential barrier formed by a P-type semiconductor region is disposed between PDs.

In the present embodiment, an equivalent circuit and a driving method are similar to those according to the first exemplary embodiment, and elements that are not described above are similar to those according to the first exemplary embodiment.

Fourth Exemplary Embodiment

Figure 7:
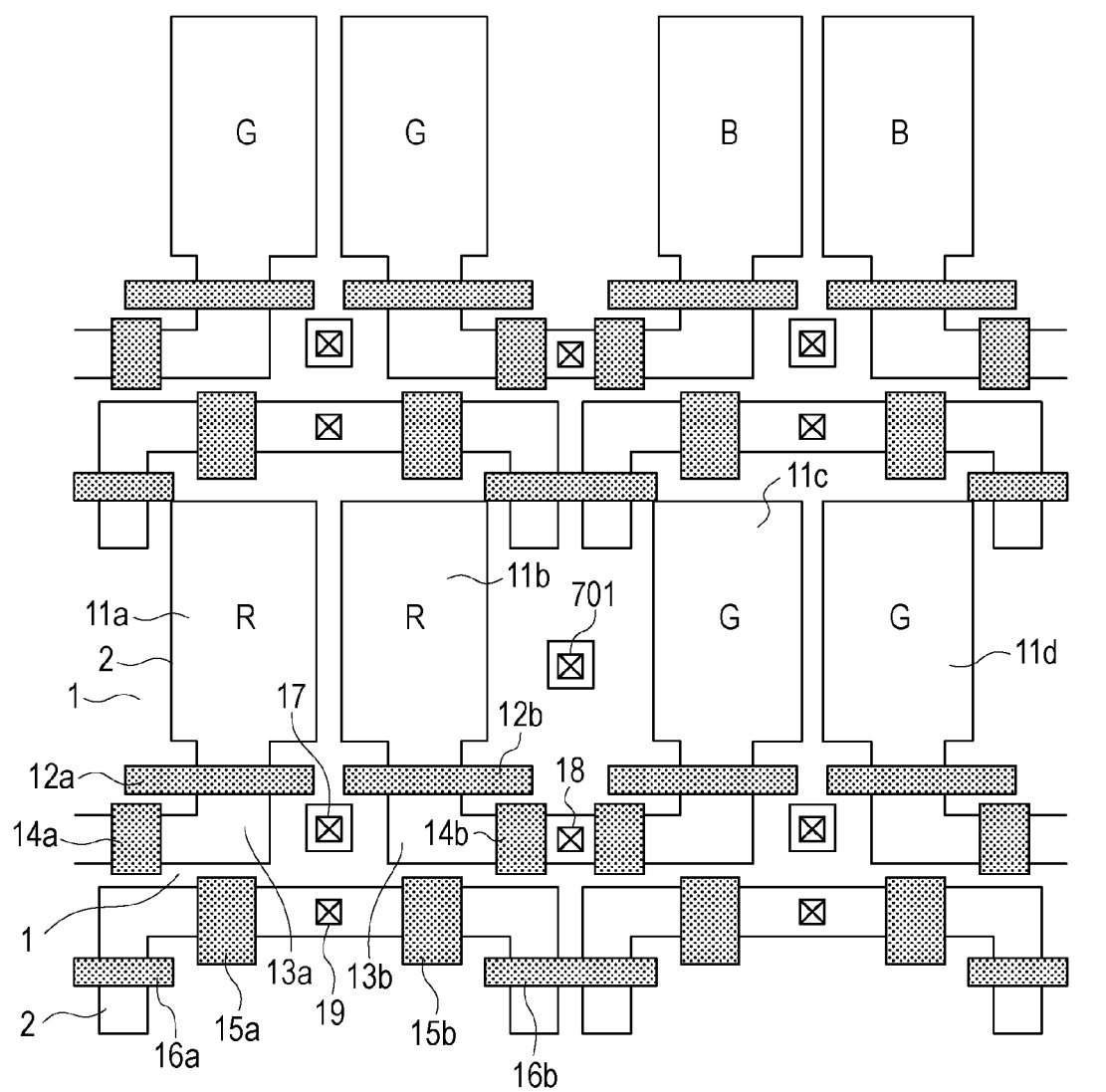
FIG. 7 is a schematic diagram illustrating a planar layout according to a fourth embodiment.

A forth exemplary embodiment is described below with reference to drawings. FIG. 7 is a schematic diagram illustrating a planar layout according to a fourth exemplary embodiment. Elements having similar functions to those of elements illustrated in FIG. 1 or 6 are denoted by similar reference symbols, and a further detailed description thereof is omitted.

In the present embodiment, a well contact plug 701 is disposed between two different-color PDs 11b and 11c. More specifically, the well contact plug 701 is located closer to the potential barrier between the two different-color PDs 11b and 11c than to a potential barrier between two same-color PDs 11a and 11b. The potential barrier may be formed by a P-type semiconductor region as in the first exemplary embodiment or by an isolating insulator unit as in the third exemplary embodiment.

As the number of well contact plugs increases, the stability increases in terms of supplying a voltage to P-type semiconductor regions such as wells. Therefore, by disposing a well contact plug between different-color PDs as required, it is possible to reduce shading due to a potential fluctuation. As a result, an improvement in image quality is achieved.

On the other hand, disposing at least part of well contact plugs between same-color PDs allows a reduction in difference in noise between the same-color PDs. It may be advantageous to dispose more than half of well contact plugs between same-color PDs. That is, when the number of well contact plugs disposed between same-color photoelectric conversion units is denoted by N, and the number of well contact plugs disposed between different-color photoelectric conversion units is denoted by M, it may be advantageous that N is greater than M, i.e., N>M in a mathematical expression. As the ratio of M to N increases, the effect of noise decreases. For example, a greater reduction in effect of noise is achieved when N:M=100:1 than when N:M=10:1.

Second Group of Embodiments

Figure 8:
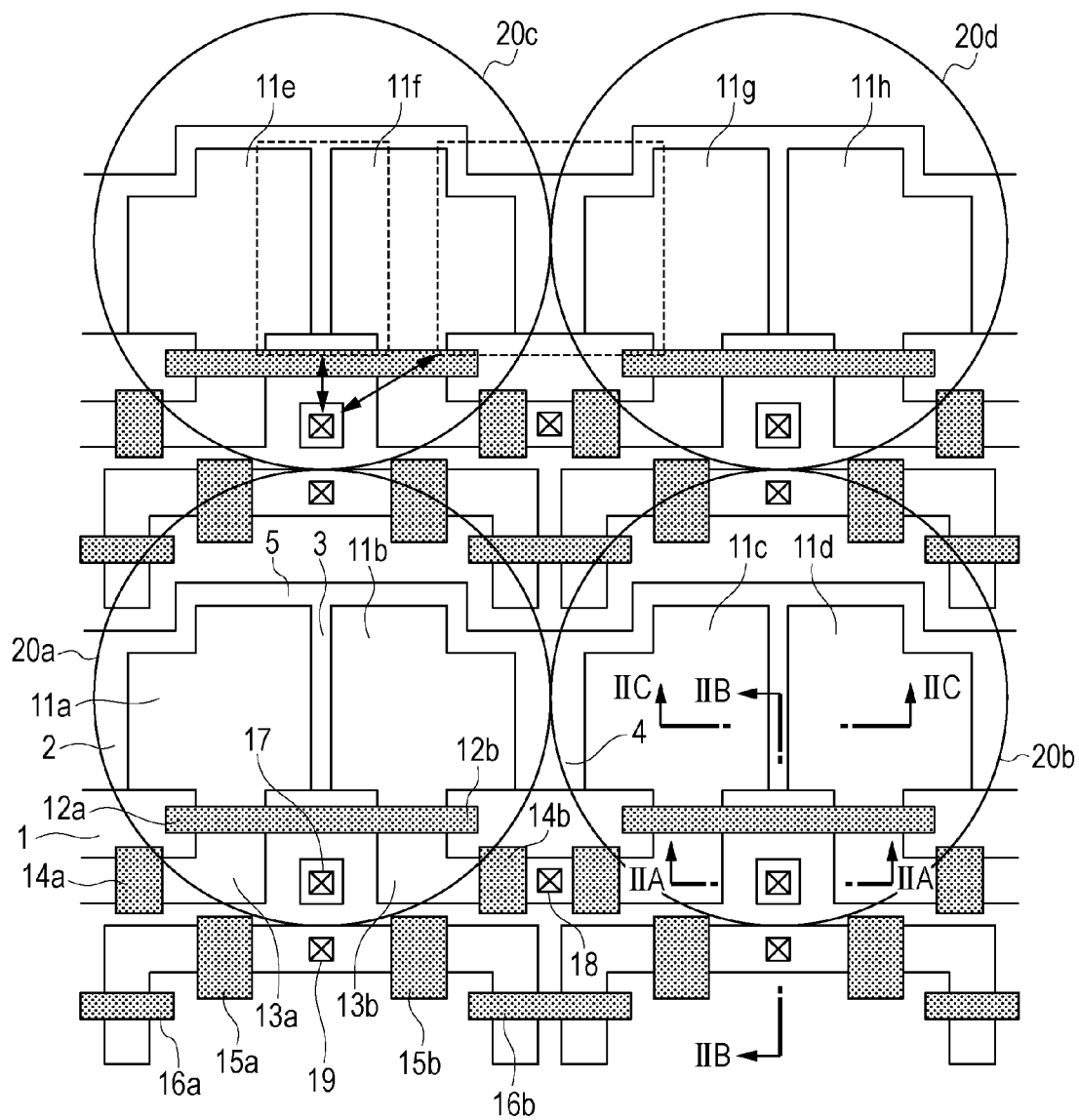
FIG. 8 is a schematic diagram illustrating a planar layout according to a fifth embodiment.

A second group of embodiments is described below with reference to FIG. 8. In the second group of embodiments, an image pickup apparatus includes a plurality of photoelectric conversion units. An image sensing area is an area in which those photoelectric conversion units are disposed. In a case where the photoelectric conversion units are disposed in the form of a two-dimensional array, the edge of the image sensing area may be defined by a line passing through photoelectric conversion units at most outward locations. Each photoelectric conversion unit is, for example, a photodiode (hereinafter, referred to as a PD) 11. Each PD includes an N-type (first conductivity type) semiconductor region and a P-type (second conductivity type) semiconductor region. A PN junction is formed by the N-type semiconductor region and the a P-type semiconductor region. The P-type semiconductor region is, for example, in the form of a P-type well. These photoelectric conversion units are arranged in a first direction. Potential barriers 3 and 4 may occur between adjacent photoelectric conversion units. An isolation unit may be disposed to electrically isolate each photoelectric conversion unit from other elements such as a transistor.

Note that the photoelectric conversion units may be arranged in the first direction such that centers of gravity of the photoelectric conversion units are in a straight line, or centers of gravity of the photoelectric conversion units are located in a zigzag manner.

In the present embodiment, the image pickup apparatus includes a lens for condensing light incident on photoelectric conversion units. A plurality of lenses may be disposed in the form of an array. The plurality of photoelectric conversion units arranged in the first direction includes a plurality of photoelectric conversion units respectively disposed below first lenses and a plurality of photoelectric conversion units respectively disposed below second lenses adjacent to corresponding first lenses. At least two photoelectric conversion units included in the plurality of photoelectric conversion units respectively disposed below the first lenses are located adjacent to each other. The lens has a function of condensing or focusing incident parallel light. Each lens may be, for example, a microlens 20 formed using an organic material.

The image pickup apparatus includes at least one contact plug 17 for supplying a particular voltage such as a ground voltage (hereinafter, referred to as a GND voltage) to a semiconductor region (hereinafter, such a contact plug is referred to as a well contact plug). The contact plug is formed using an electrically conductive material such that the contact plug is in contact with the semiconductor region. For example, the contact plug is formed using a metal such as tungsten or an alloy. The contact plug may include a barrier metal and the barrier metal may be in contact with the semiconductor region. The contact plug may also be connected to a wiring.

The well contact plug is a contact plug constructed in the form of a well which is disposed so as to be in contact with the semiconductor region configured to accumulate a signal charge generated in the photoelectric conversion unit. In a case where the photoelectric conversion unit is realized by a PD including a PN junction and electrons are accumulated as signal charges, the well contact plug is connected to a P-type semiconductor region of the PD. In this case, the P-type semiconductor region may be formed such that the P-type semiconductor region continuously extends from the PN junction plane to the well contact plug. Note that the P-type semiconductor region may include a part with a high impurity concentration and a part with a low impurity concentration. For example, the P-type semiconductor region may include a part with a higher impurity concentration in contact with the contact plug than impurity concentrations of other parts. On the other hand, in a case where the photoelectric conversion unit accumulates holes as signal charges, the well contact plug is connected to an N-type semiconductor region.

In the image pickup apparatus according to embodiments, the number of well contact plugs disposed in the image sensing area is less than the number of photoelectric conversion units. For example, well contact plugs are disposed such that there is one well contact plug for each two photoelectric conversion units. It may be advantageous to dispose well contact plugs in a periodic pattern, although the well contact plugs may be disposed randomly. It may be advantageous to provide two or more well contact plugs in the image sensing area, although the image sensing area may include only one well contact plug.

In the second group of the embodiments, at least part of well contact plugs are each located closer to a potential barrier between two photoelectric conversion units disposed below one lens than to a potential barrier between two photoelectric conversion units disposed below different lenses. That is, the distance from the well contact plug to any of two photoelectric conversion units disposed below one lens is smaller than the distance from the well contact plug to any of two photoelectric conversion units disposed below different lenses. In other words, the well contact plug is disposed in a region between two photoelectric conversion units that are disposed below one lens and that are disposed adjacently in the first direction.

The potential barrier is a region in which a potential for signal charges accumulated in the photoelectric conversion unit is higher than in the photoelectric conversion unit. For example, in a case where the photoelectric conversion unit is realized by a PD including a PN junction and signal charges are electrons, then the potential barrier is a region in which a potential for electrons is higher than in an N-type semiconductor region. On the other hand, in the case where signal charges are holes, then the potential barrier is a region in which a potential for holes is higher than in a P-type semiconductor region. The potential barrier may be formed by an isolating insulator unit such as STI (Shallow Trench Isolation), LOCOS (LOCal Oxidation of Silicon), a mesa-type isolation unit, or the like. Insulators have a greater band gap than semiconductors have. Therefore, an insulator may be used to form a potential barrier for both types of carries, i.e., electrons and holes, in a semiconductor. In the case where signal charges are electrons, the potential barrier may be formed by a P-type semiconductor region. On the other hand, in the case where signal charges are holes, the potential barrier may be formed by an N-type semiconductor region. Alternatively, the potential barrier may be formed by disposing an electrode on a semiconductor substrate and applying a voltage to the electrode so as to form the potential barrier. As the voltage applied to the electrode becomes lower, the potential for electrons becomes higher. Conversely, as the voltage applied to the electrode becomes higher, the potential for holes becomes higher.

In all embodiments described below in the present description, states expressed by "a potential barrier is disposed or formed", include at least a state in which a potential barrier is formed or may be formed in any of the configurations described above.

A potential barrier between two photoelectric conversion units is a part located between N-type semiconductor regions included in the respective photoelectric conversion units. An example of such a potential barrier is that in a region enclosed in a dotted-line box in FIG. 8.

In a case where the potential barrier is formed by an isolating insulator unit, the distance from the potential barrier is defined by the distance from an edge of the insulator forming the potential barrier. In the case where the potential barrier is formed by a semiconductor region, the distance from the potential barrier is defined by the distance from an edge of the P-type semiconductor region forming the potential barrier. In the case where the potential barrier is formed by applying a voltage to an electrode, the distance from the potential barrier is defined by the distance from an edge of the electrode. In this case, the distance from the well contact plug to the photoelectric conversion unit is defined by the distance from the well contact plug to an edge of the semiconductor region that is included in the photoelectric conversion unit and that accumulates electric charges. For example, in the case where signal charges are electrons, the distance is defined by the distance from the well contact plug to the edge of the N-type semiconductor region.

As described above, at least part of the well contact plugs are each disposed in a region between two photoelectric conversion units disposed below one lens. This allows a reduction in the effect of noise caused by the well contact plugs, as is described in further below.

In the present group of embodiments, a plurality of photoelectric conversion units are disposed below one lens. In this configuration, it is allowed to perform a focus detection by independently reading out signals from the photoelectric conversion units. However, if there is a difference in amount of noise among the photoelectric conversion units, the difference makes it difficult to perform accurate focus detection.

As a comparative example, a discussion is given below on a structure in which well contact plugs are each disposed only between photoelectric conversion units disposed below different lenses. In this case, the distance from one of two photoelectric conversion units disposed below one lens to a well contact plug is smaller than the distance from the other one to the well contact plug. More specifically, in FIG. 8, let's us assume that a well contact plug is disposed only between a PD 11*b* and a PD 11*c*. In this case, the distance from the PD 11*b* to the well contact plug is smaller than the distance from a PD 11*a* to the well contact plug. Note that the PD 11*a* and PD 11*b* are photoelectric conversion units that are disposed below a first microlens 20*a* and that are located adjacently. A PD 11*c* is a photoelectric conversion unit that is disposed below a second microlens 20*b* different from the first microlens 20*a*. In this configuration of the comparative example, a dark current caused by the well contact plug flows more into the photoelectric conversion unit located closer to the well contact plug. As a result, there may be a great difference in noise between two photoelectric conversion units disposed adjacently below one lens. Such a great difference in noise between photoelectric conversion units disposed below one lens may cause a reduction in focus detection accuracy.

Let us consider another comparative example in which a plurality of lenses are disposed and two photoelectric conversion units are disposed adjacently below each lens, and furthermore a well contact plug is disposed between each two lenses located adjacently in the first direction. More specifically, for example, a first well contact plug is disposed between a PD (not shown) left to the PD 11*a* and the PD 11*a*, and a second well contact plug is disposed between the PD 11*b* and PD 11*c*. In this case, the distance from the PD 11*a* to the first well contact plug is nearly equal to the distance from the PD 11*b* to the second well contact plug. However, as described above, a variation in production process condition may cause a great difference between an amount of dark current generated in a contact plug and an amount of dark current generated in another different contact plug. Therefore, there may be a difference between the magnitude of noise in the PD 11*a* and the magnitude of noise in the PD 11*b*. That is, there may be a great difference in noise between two photoelectric conversion units disposed adjacently below one lens. Such a great difference in noise between photoelectric conversion units disposed below one lens may cause a reduction in focus detection accuracy.

In contrast, in the present group of embodiments, a well contact plug is disposed in a region between two photoelectric conversion units disposed below one lens. The region between two photoelectric conversion units disposed below one lens is, for example, a region in which a well contact plug 17 is disposed in FIG. 8. This configuration allows dark currents flowing into the respective two photoelectric conversion units to be nearly equal, which results in an improvement in focus detection accuracy.

Note that it may be advantageous to dispose well contact plugs such that any well contact plug is located between in some region between two photoelectric conversion units disposed below one lens. However, to achieve a particular electric characteristic, part of well contact plugs may be disposed in a region between two photoelectric conversion units disposed below different lenses. Note that this configuration also falls within the scope of the embodiments.

In this group of embodiments, a wavelength selection unit such as a color filter may be disposed on each photoelectric conversion unit. For example, when a color filter that allows light in a red wavelength range to pass through is disposed on a photoelectric conversion unit, light in the red wavelength range is incident on this photoelectric conversion unit. A plurality of photoelectric conversion units arranged in the first direction include a plurality of photoelectric conversion units on which light in a first wavelength range (for example, a red wavelength range) is incident and a plurality of photoelectric conversion units on which light in a second wavelength range (for example, a green wavelength range) is incident.

The photoelectric conversion units assigned with the respective colors are disposed alternately in a periodic pattern. At least two photoelectric conversion units on which light with the same color is incident are disposed adjacent to each other. For example, two photoelectric conversion units on which red light is incident (hereinafter, also referred to simply as "red photoelectric conversion units") are disposed adjacent to each other, and two photoelectric conversion units on which green light is incident (hereinafter, also referred to simply as "green photoelectric conversion units") are disposed adjacent to each other next to the two red photoelectric conversion units. A series of these four photoelectric conversion units is disposed periodically, i.e., photoelectric conversion units are disposed in the order red, red, green, green, red, red, green, green, and so on. Note that the number of photoelectric conversion units included in a basic unit in the periodic pattern is not limited to two. For example, the basic unit may include two adjacent red photoelectric conversion units and one green photoelectric conversion unit next to the two red photoelectric conversion units, and this basic unit including three photoelectric conversion units may be repeated.

Color filters may be disposed such that colors are different for respective lenses. For example, a red color filter may be disposed on photoelectric conversion units disposed below the first microlens 20a, and a green color filter may be disposed on photoelectric conversion units disposed below the second microlens 20b.

Next, embodiments of the first group are respectively described below. Note that in the following description of these embodiments, it is assumed by way of example that the first conductivity type is N-type and the second conductivity type is P-type, and it is also assumed that electrons are accumulated as signal charges in the photoelectric conversion units. Note that the first conductivity type may be P-type and the second conductivity type may be N-type, which also falls in the scope of the embodiments. In this case, holes are accumulated as signal charges in the photoelectric conversion units. These embodiments are different from the previous embodiments only in that the conductivity types are opposite, and thus a description thereof is omitted. Note that the scope of the embodiments also includes an image pickup system including an image pickup apparatus according to one of the embodiments described below and a signal processing apparatus configured to process a signal output from the image pickup apparatus. The signal processing apparatus may be realized using a known technique.

Fifth Exemplary Embodiment

A fifth exemplary embodiment is described below with reference to drawings. FIG. 8 is a schematic diagram illustrating a planar layout according to the fifth exemplary embodiment. Elements having similar functions to those of elements illustrated in FIG. 1 are denoted by similar reference symbols.

Also in the present embodiment, each element is denoted by a combination of a numeral and an alphabetic character. Elements which are similar in function are denoted by similar numerals. An alphabetic character following a numeral indicates a correspondence to a PD. When distinguishment is not necessary, only a numeral is used to generically denote an element with no alphabetic suffix.

The image pickup apparatus according to the present embodiment includes a semiconductor substrate including a field region 1 and an active region 2. The semiconductor substrate is, for example, a silicon substrate. The field region 1 is an isolating insulator unit such as STI or LOCOS. The insulator is, for example, a silicon oxide film. In the active region 2, a semiconductor region forming a photoelectric conversion unit or a transistor is disposed.

In the active region 2, PDs 11a to 11h are disposed. Each PD includes an N-type semiconductor region. The N-type semiconductor region and a P-type semiconductor region form a PN junction and thus form a PD. The P-type semiconductor region forming the PD includes, for example, a dark current preventing layer disposed on a surface, a semiconductor region forming a potential barrier, a dark current preventing layer disposed adjacent to an isolating insulator unit, a channel stopper layer, a well, a semiconductor substrate, etc. In the N-type semiconductor region forming the PD, electrons are accumulated as signal charges.

In the present embodiment, a plurality of microlenses 20a to 20d are disposed in a two-dimensional array. Two PDs 11a and 11b are disposed below the first microlens 20a. Two PDs 11c and 11d are disposed below the second microlens 20b. These PDs 11a to 11d are arranged in a line in the first direction.

In the present embodiment, a potential barrier 3 formed by a P-type semiconductor region is disposed between two PDs 11a and 11b disposed below the first microlens 20a. Furthermore, a potential barrier 4 formed by a P-type semiconductor region is disposed between the PD 11b disposed below the first microlens 20a and the PD 11c disposed below the second microlens 20b. The P-type semiconductor region forming the potential barrier 4 has a length in the first direction greater than the length in the first direction of the P-type semiconductor region forming the potential barrier 3. An edge of the P-type semiconductor region is a PN junction plane. That is the distance between the N-type semiconductor region included in the PD 11b and the N-type semiconductor region included in the PD 11c is greater than the distance between the N-type semiconductor region included in the PD 11a and the N-type semiconductor region included in the PD 11b.

A P-type semiconductor region 5 is disposed between a PD and the isolating insulator unit forming the field region 1. The P-type semiconductor region 5 serves as a dark current preventing layer that reduces intruding of a dark current generated at an interface of the insulator into the PD.

The active region 2 includes floating diffusion (hereinafter referred as FD) regions 13a and 13b, into which electric charges are to be transferred from PDs. The active region 2 also includes transfer transistors 12a and 12b configured to an electric charge from the FD 11 to the FD region 13. The FD regions 13a and 13b are respectively connected to amplifying transistors 15a and 15b via wirings (not shown). The amplifying transistors 15a and 15b are amplifying elements configured to amply signals generated by PDs. The active region 2 also includes reset transistors 14a and 14b and selection transistors 16a and 16b. The reset transistor 14 resets an input of an amplifying transistor to a particular voltage. The selection transistor 16 controls an electrical connection between a source of the amplifying transistor and a vertical output line (not shown). In the present embodiment, drains of the amplifying transistors 15a and 15b are formed by a common semiconductor region and connected to a power supply line via a common contact plug 19. Drains of two reset transistors 14 corresponding to different-color photoelectric conversion units are formed by a common semiconductor region and connected to a common contact plug 18.

In the present embodiment, a well contact plug 17 is disposed to supply a voltage to a P-type semiconductor region forming a PD. The well contact plug 17 is formed by an electrically conductive material such as tungsten. The well contact plug 17 is disposed at a location closer to the potential barrier disposed between the PDs 11a and 11b than to the potential barrier 4 between the PDs 11b and 11c. That is, the well contact plug 17 is disposed in a region between the two PDs 11a and 11b disposed below the one microlens 20a.

Furthermore, the well contact plug 17 is located in a region extending, in a second direction cross the first direction, from the P-type semiconductor region forming the potential barrier 3. That is, the well contact plug 17 located outside the potential barrier 3. The well contact plug 17 may be located at the center between two photoelectric conversion units as shown in FIG. 7. Edge of a P-type semiconductor region is at a boundary between the P-type semiconductor region and an insulator forming an isolating insulator unit or at a boundary between the P-type semiconductor region and an N-type semiconductor region.

In the present embodiment, no well contact plug is disposed between different-color photoelectric conversion units. However, to achieve a particular electric characteristic, a well contact plug may be disposed between different-color photoelectric conversion units.

Note that the contact plug 18 for supplying a voltage to the drain of the amplifying transistor 15 may be disposed at a location closer to the potential barrier 3 than to the potential barrier 4. The amplifying transistor 15 is disposed in the image sensing area.

FIGS. 2A, 2B, and 2C are schematic diagrams illustrating cross sections of the image pickup apparatus according to the fifth exemplarity embodiment. FIG. 2A illustrates a cross section taken along line IIA-IIA of FIG. 8. FIG. 2B illustrates a cross section taken along line IIB-IIB of FIG. 8. FIG. 2C illustrates a cross section taken along line IIC-IIC of FIG. 8.

As illustrated in FIG. 2A and FIG. 2B, the well contact plug 17 is in contact with a high-concentration P-type semiconductor region 201. It may be advantageous that the P-type semiconductor region 201 has an impurity concentration higher than that of the neighboring P-type semiconductor region 203a. By electrically connecting the high-concentration semiconductor region to the well contact plug 17 in the above-described manner, it becomes possible to reduce a contact resistance between the well contact plug 17 and the semiconductor region.

An isolating insulator unit (field region 1) is disposed between the region in which the well contact plug 17 is disposed and neighboring elements. For example, as illustrated in FIG. 2B, an isolating insulator unit (field region 1) is disposed between the P-type semiconductor region 203a in which the well contact plug 17 is disposed and the P-type semiconductor region forming the potential barrier 3. The isolating insulator unit (field region 1) it is possible to suppress the effect of the dark current due to the well contact plug 17 such that the amount of dark current reaching the photoelectric conversion unit is reduced.

The P-type semiconductor region 5 is disposed below the isolating insulator unit (field region 1). Thus, the P-type semiconductor region continuously extends from the well contact plug 17 to the PN junction plane of the P-type semiconductor region forming the potential barrier 3. Therefore, even in the structure in which the potential barrier 3 is isolated by the isolating insulator unit (field region 1) from the part at which the well contact plug 17 is in contact with the semiconductor region.

Although not shown in FIG. 2B, a gate electrode of the transfer transistor 12 is disposed on the isolating insulator unit disposed between the well contact plug 17 and the potential barrier 3. When the photoelectric conversion unit is accumulating a signal charge, it is possible to supply a voltage to the gate electrode of the transfer transistor 12 such that a potential barrier for the signal charge is formed. For example, in the case where the signal charge is provided by electrons, the same voltage as the GND voltage supplied to the wells or a negative voltage lower than the GND voltage is supplied. Therefore, in this configuration, it is possible to suppress the effect of the dark current due to the well contact plug 17 such that the amount of dark current reaching the photoelectric conversion unit is reduced.

The P-type semiconductor regions 203a to 203e may function as part of a well or the potential barriers 3 and 4. An N-type semiconductor region 204 is disposed below the P-type semiconductor regions 203.

FIG. 2C illustrates cross sections of two PDs 11c and 11d disposed below the one microlens 20b. As illustrated in FIG. 2C, the PDs 11 are disposed on an N-type epitaxial layer 205. Each PD 11 may include an N-type semiconductor region with an impurity concentration higher than that of the N-type epitaxial layer 205. The potential barrier 3 is disposed between the PD 11c and the PD 11d. The potential barrier 3 includes P-type semiconductor regions 203a to 203c disposed on a side of a surface of the semiconductor substrate. In a deep part of the substrate, the N-type epitaxial layer 205 continuously extends from the PD 11c to the PD 11d. By forming the N-type semiconductor region such that it continuously extends in the deep part of the substrate as described above, the two PDs are electrically connected. As a result, when saturation occurs in one of the PDs, an overflowing electric charge easily flows into the other PD, which results in an improvement in sensitivity.

A P-type semiconductor region 202 is disposed on the surfaces of the PDs 11. The P-type semiconductor region 202 functions as a dark current preventing layer that prevents a dark current generated on the surface from intruding into the PDs. The P-type semiconductor region 202 may be disposed in a region in which the well contact plug 17 is disposed.

Next, referring to an equivalent circuit diagram illustrated in FIG. 3A and a driving diagram illustrated in FIG. 3B, an operation according to the present embodiment is described below. The equivalent circuit diagram illustrated in FIG. 3A includes PDs 101 and 102, transfer transistors 103 and 104, amplifying transistors 105 and 106, selection transistors 107 and 108, FD nodes 109 and 110, reset transistors 111 and 112, signal output lines 113 and 114 for outputting a signal. FIG. 3B illustrates driving pulses respectively supplied to a SEL node, a RES node, and a TX node illustrated in FIG. 3A.

When the reset transistors 111 and 112 turn on, the corresponding FD nodes 109 and 110 are reset to a reset voltage (for example, a voltage equal to a power supply voltage). Thereafter, when the selection transistors 107 and 108 turn on, it becomes possible to output signals from the corresponding amplifying transistors 105 and 106 to the respective signal output lines 113 and 114.

Light condensed through the lens is incident on the PDs 101 and 102. The respective PDs 101 and 102 generate and accumulate charges corresponding to amounts of incident light. Thereafter, when the transfer transistors 103 and 104 turn on, the electric charges accumulated in corresponding photoelectric conversion units are transferred to the respective FD nodes 109 and 110. The FD nodes 109 and 110 are input nodes of the amplifying transistors 105 and 106. Based on the charges transferred to the FD nodes 109 and 110, the amplifying transistors 105 and 106 output signals to the respective signal output lines 113 and 114.

Note that the selection transistors may be omitted. In this case, for example, a selection operation may be performed by controlling the reset voltage supplied to the FDS.

In the present embodiment, two photoelectric conversion units are disposed below one microlens. This makes it possible to perform both an image capturing operation and a focus detection operation. Light condensed by the microlens 20a is divided into two pieces of light, which are respectively incident on the PDs 11a and 11b. The respective PDs 11a and 11b generate and accumulate charges corresponding to amounts of incident light. The transfer transistors 12a and 12b transfer the charges accumulated in the corresponding photoelectric conversion units to the respective FD regions 13a and 13b. Based on the charges transferred to the FD nodes 13a and 13b, the amplifying transistors 15a and 15b output signals to the respective signal output lines. As described above, it is possible to perform a focus detection based on a phase difference by independently reading out signals from the two PDs 11a and 11b and performing particular signal processing on the signals. It is also possible to perform a normal image taking operation by adding the output signals.

In the configuration described above, the well contact plug 17 is disposed at a location substantially equally apart from the PDs 11a and 11b. This causes the PDs 11a and 11b to substantially equally receive a diffusing dark current due to the well contact plug 17. That is, it is possible to reduce the difference in intruding noise between the two PDs disposed below one lens, which results in an improvement in focus detection accuracy.

In the present embodiment, color filters are disposed such that colors are different for respective microlenses, and thus photoelectric conversion units disposed below one microlens are provided with a same-color filter. For example, the PD 11a and the PD 11b are covered with a red color filter. The PD 11c to the PD 11f are covered with a green color filter. The PD 11g and the PD 11h are covered with a blue color filter.

In the present embodiment, the image pickup apparatus may be configured to be monochrome. In this case, wavelength selection units such as color filters may be omitted, or a wavelength selection unit may be disposed such that all pixels detect light in the same wavelength range.

Modifications of Fifth Exemplary Embodiment

The fifth exemplary embodiment may be modified by combining the fifth exemplary embodiment with one of the second to fourth exemplary embodiments. In these modifications, the configuration according to one of the second to fourth exemplary embodiments is modified such that each color filter disposed on a plurality of same-color photoelectric conversion units is replaced with one microlens. For example, in FIGS. 4 to 7, PDs 11a and 11b are disposed below a first microlens, and PDs 11c and 11d are disposed below a second microlens. In this configuration, color filters may or may not be disposed.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-008198, filed Jan. 18, 2012, which is hereby incorporated by reference herein in its entirety.

What is claimed is:
1. An image pickup apparatus comprising:
a plurality of photoelectric conversion units each including a first-conductivity-type first semiconductor region configured to accumulate a signal charge and disposed in contact with a second-conductivity-type semiconductor region;
a potential barrier formed between photoelectric conversion units included in the plurality of photoelectric conversion units; and
a plurality of contact plugs which are disposed in an image sensing area and configured to supply a voltage to the second-conductivity-type semiconductor region, the plurality of photoelectric conversion units being disposed in the image sensing area, wherein
a number of contact plugs is smaller than a number of photoelectric conversion units included in the plurality of photoelectric conversion units,
the plurality of photoelectric conversion units include a first photoelectric conversion unit (PCU) and a second PCU, both configured to receive light of a first color and a third PCU configured to receive light of a second color,
the first, second, and third PCUs are arranged respectively in a line in a first direction,
the first and second PCUs are adjacent to each other in a first direction,
the second and third PCUs are adjacent to each other in the first direction,
the potential barrier includes a first part formed between the first and second PCUs and the potential barrier includes a second part formed between the second and third PCUs, and
a distance from a contact plug of the plurality of contact plugs to the first part of the potential barrier is smaller than a distance from the contact plug to the second part of the potential barrier.

2. The image pickup apparatus according to claim 1, wherein the contact plug is disposed such that a second direction from a region disposed between the first-conductivity-type first semiconductor regions respectively included in the first and second PCUs toward the contact plug crosses the first direction.

3. The image pickup apparatus according to claim 2, wherein
a wiring configured to supply the voltage to the contact plug is disposed in the first direction, and not disposed between the first and second PCUs.

4. The image pickup apparatus according to claim 1, wherein
the second-conductivity-type semiconductor region includes a second-conductivity-type second semiconductor region forming the first part of the potential barrier,
the contact plug is disposed in contact with a second-conductivity-type third semiconductor region,
an isolating insulator unit is disposed between the second semiconductor region and the third semiconductor region, and
the second-conductivity-type semiconductor region continuously extends from the third semiconductor region to a PN junction portion between the first semiconductor region and the second semiconductor region, and is disposed under the isolating insulator unit.

5. The image pickup apparatus according to claim 4, wherein the first-conductivity-type first semiconductor regions respectively included in the first and second PCUs are electrically connected via a first-conductivity-type semiconductor region disposed below the second semiconductor region.

6. The image pickup apparatus according to claim 1, wherein the contact plug is disposed in a region where the first part of the potential barrier is formed.

7. The image pickup apparatus according to claim 1, wherein half or more of the contact plugs included in the plurality of contact plugs are disposed at locations closer to the first part than to the second part.

8. The image pickup apparatus according to claim 1, wherein every contact plug included in the plurality of contact plugs is disposed at a location closer to the first part than to the second part.

9. The image pickup apparatus according to claim 1, wherein a length of the first part of the potential barrier as seen in the first direction is smaller than a length of the second part of the potential barrier as seen in the first direction.

10. The image pickup apparatus according to claim 1, further comprising a plurality of amplifying transistors disposed in the image sensing area, each being configured to output a signal based on an amount of charges generated by a corresponding one of the plurality of photoelectric conversion units, wherein
a second contact plug for supplying a voltage to a drain of the amplifying transistor is disposed at a location closer to the first part than to the second part.

11. The image pickup apparatus according to claim 1, wherein at least one of a transfer transistor configured to transfer an electric charge from a photoelectric conversion unit, an amplifying transistor configured to amplify the electric charge and output a signal, and a reset transistor configured to reset an input node of the amplifying transistor is disposed between the first and second PCUs.

12. The image pickup apparatus according to claim 1, further comprising a lattice-shaped electrically conductive material electrically connected to the plurality of contact plugs, wherein
part of the electrically conductive material is disposed on a region between the first and second PCUs.

13. An image pickup system comprising:
the image pickup apparatus according to claim 1; and
a signal processing apparatus configured to process a signal output from the image pickup apparatus.

14. The image pickup apparatus according to claim 1, wherein the first part and the second part are arranged in the first direction.

15. The image pickup apparatus according to claim 1, wherein
a fourth PCU configured to receive light of the second color,
the first, second, third, and fourth PCUs are arranged respectively in a line in the first direction.

16. An image pickup apparatus comprising:
a plurality of photoelectric conversion units each including a first-conductivity-type first semiconductor region configured to accumulate a signal charge and disposed in contact with second-conductivity-type semiconductor region;
a potential barrier formed between photoelectric conversion units included in the plurality of photoelectric conversion units; and
a plurality of contact plugs which are disposed in an image sensing area and configured to supply a voltage to the second-conductivity-type semiconductor region, the plurality of photoelectric conversion units being disposed in the image sensing area, wherein
a number of contact plugs is smaller than a number of photoelectric conversion units included in the plurality of photoelectric conversion units,
the plurality of photoelectric conversion units include a first photoelectric conversion unit (PCU) and a second PCU, both disposed below a first lens, and a third PCU disposed below a second lens,
the first, second, and third PCUs are arranged respectively in a line in a first direction,
the first and second PCUs are adjacent to each other in a first direction,
the second and third PCUs are adjacent to each other in the first direction,
the potential barrier includes a first part formed between the first and second PCUs, and a second part formed between the second and third PCUs, and
a distance from a contact plug of the plurality of contact plugs to the first part of the potential barrier is smaller than the distance from the contact plug to the second part of the potential barrier.

17. An image pickup system comprising:
the image pickup apparatus according to claim 16; and
a signal processing apparatus configured to process a signal output from the image pickup apparatus.

18. The image pickup apparatus according to claim 16, wherein the contact plug is disposed such that a second direction from a region disposed between the first conductivity type first semiconductor regions respectively included in the first and second PCUs toward the contact plug crosses the first direction.

19. The image pickup apparatus according to claim 18, wherein
a wiring configured to supply the voltage to the contact plug is disposed in the first direction, and not disposed between the first and second PCUs.

20. The image pickup apparatus according to claim 16, wherein
a fourth PCU disposed below the second lens,
the first, second, third and fourth PCUs are arranged respectively in a line in the first direction.

* * * * *